(12) United States Patent
Yamamoto

(10) Patent No.: US 6,803,293 B2
(45) Date of Patent: Oct. 12, 2004

(54) METHOD OF PROCESSING A SEMICONDUCTOR WAFER

(75) Inventor: Masayuki Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/362,489

(22) PCT Filed: Aug. 27, 2001

(86) PCT No.: PCT/JP01/07365
§ 371 (c)(1),
(2), (4) Date: Aug. 18, 2003

(87) PCT Pub. No.: WO02/19393
PCT Pub. Date: Mar. 7, 2002

(65) Prior Publication Data
US 2004/0038469 A1 Feb. 26, 2004

(30) Foreign Application Priority Data
Aug. 30, 2000 (JP) ........................................ 2000-260924

(51) Int. Cl.[7] ............................................... H01L 21/46
(52) U.S. Cl. ...................................... 438/459; 438/110
(58) Field of Search ................................. 438/110, 113, 438/118, 459, 460, 464, 690–692, 977

(56) References Cited

U.S. PATENT DOCUMENTS

| 5,476,566 A | 12/1995 | Cavasin |
| 6,162,703 A * | 12/2000 | Muntifering et al. ....... 438/465 |
| 6,398,892 B1 * | 6/2002 | Noguchi et al. .............. 156/85 |

FOREIGN PATENT DOCUMENTS

| EP | 0 999 853 A2 | 5/2000 |
| JP | 59-56471 | 3/1984 |
| JP | 5-291397 | 11/1993 |
| JP | 2000-216115 | 8/2000 |
| WO | WO 01/03180 A1 | 1/2001 |

* cited by examiner

Primary Examiner—David Nelms
Assistant Examiner—David Vu
(74) Attorney, Agent, or Firm—Knobbe Martens Olson & Bear, LLP

(57) ABSTRACT

The present invention is to provide a method of processing a semiconductor wafer, comprising the steps of: sticking a support wafer onto a front surface of a semiconductor wafer having a pattern formed thereon, with a two-sided adhesive sheet; and performing a thinning process on a rear surface of the semiconductor wafer. By sticking the support wafer onto the semiconductor wafer with the two-sided adhesive sheet, sufficient strength and rigidity can be obtained even after a thinning process is carried out.

2 Claims, 2 Drawing Sheets

METHOD OF PROCESSING A SEMICONDUCTOR WAFER

TECHNICAL FIELD

The present invention relates to a method of performing a thinning process on a semiconductor wafer.

BACKGROUND ART

Hitherto, mechanical methods or chemical methods such as, for example, a grinding method, a polishing method (CMP), and an etching method are known as a method of performing a thinning process on a semiconductor wafer. Generally, these methods all adopt a method in which a protective tape is stuck onto the front surface of a semiconductor wafer having a wiring pattern formed thereon and, after protecting the wiring pattern and fixing the semiconductor wafer, the rear surface of the semiconductor wafer is subjected to a thinning process.

However, according as the process of thinning a semiconductor wafer proceeds, the strength and rigidity of the semiconductor wafer decreases. As a result of this, breaking of the semiconductor wafer due to the decrease in the strength of the semiconductor wafer and warping of the semiconductor wafer due to the decrease in the rigidity are generated. Under these circumstances, full attention must be paid in handling the semiconductor wafers, but even if full attention is paid in handling the semiconductor wafers, there arises a problem of decrease in the yield because the semiconductor wafers are often broken. Further, there is a problem in that the decrease in the strength and rigidity of the semiconductor wafers due to the thinning process makes it impossible to perform a conveying process using a wafer carrier or the like, thereby leading to decrease in the workability.

To resolve these problems, a method is studied in which the front surface of a semiconductor wafer having a pattern formed thereon is fixed onto a hard material such as a quartz plate or an acryl plate, and the rear surface thereof is ground. However, the above-mentioned method involves a problem such that the wafer made of a brittle material is broken in releasing the semiconductor wafer, which is thinned by grinding, from the hard material.

An object of the present invention is to provide a method of thinning a semiconductor wafer so that the generation of breaking or warping in the step of performing a thinning process on a semiconductor wafer using a protective tape can be restrained, and the process of conveying the semiconductor wafer to the next step can be carried out.

Further, an object of the present invention is to provide a method of thinning a semiconductor wafer that can easily release the protective tape after the thinning process.

DISCLOSURE OF INVENTION

The present invention has been made in view of these circumstances. As a result of eager studies in order to solve the aforesaid problems, the inventors of the present invention have found out that the aforesaid object can be achieved by the following method, thereby completing the present invention.

The present invention relates to a method of processing a semiconductor wafer, comprising the steps of: sticking a support wafer onto a front surface of a semiconductor wafer having a pattern formed thereon, with a two-sided adhesive sheet; and performing a thinning process on a rear surface of the semiconductor wafer, in a state to which said support wafer is fixed.

According to the above-mentioned method, in performing a thinning process on the rear surface of the semiconductor wafer, the support wafer is fixed via the two-sided adhesive sheet onto the front surface of the semiconductor wafer having a wiring pattern formed thereon, so that even when the semiconductor wafer is thinned by the thinning process, the strength and rigidity are imparted to the semiconductor wafer by the support wafer, and the generation of breaking or warping of the semiconductor wafer in the thinning process can be restrained, thereby making it easier to handle the semiconductor wafers in the thinning process. Furthermore, it is easy to perform a conveying process using a wafer carrier or the like, thereby providing a good workability. Since the support wafer is stuck onto the front surface of the semiconductor wafer with the two-sided adhesive sheet, the protective tape for protecting the front surface of the semiconductor wafer, which tape was conventionally used in the thinning process, is no longer needed. Further, the support wafer makes it easier to release the semiconductor wafer, and the breaking of semiconductor wafers is not generated in releasing the semiconductor wafers as in the case of hard materials.

In the aforesaid method of processing a semiconductor wafer, it is preferable that an adhesive surface of the two-sided adhesive sheet on the side that is stuck onto the front surface of the semiconductor wafer is one whose adhesive force to the front surface of said semiconductor wafer can be reduced after the thinning process.

When a two-sided adhesive sheet having an adhesive surface with the aforesaid property is used, the support wafer can be easily removed from the front surface of the semiconductor wafer in releasing the support wafer after the process of thinning the semiconductor wafer.

In the aforesaid method of processing a semiconductor wafer, it is preferable that an adhesive surface of the two-sided adhesive sheet on the side that is stuck onto the front surface of the semiconductor wafer is a thermoreleasing type adhesive surface.

According to a thermoreleasing type two-sided adhesive sheet having a thermoreleasing type adhesive surface, the support wafer can be removed with ease and certainty from the front surface of the semiconductor wafer in releasing the support wafer after the process of thinning the semiconductor wafer.

Further, the present invention relates to a two-sided adhesive sheet for processing a semiconductor wafer, which is used in the aforesaid method of processing a semiconductor wafer. The aforesaid two-sided adhesive sheet is effectively used in the above-mentioned method of processing a semiconductor wafer according to the present invention.

A view of steps for describing a thinning step performed on a semiconductor wafer of the present invention and a subsequent dicing step.

FIG. 2

An example of an outlook view of a two-sided adhesive sheet.

FIG. 3

A cross-sectional view of a two-sided adhesive sheet.

BEST MODE FOR CARRYING OUT THE INVENTION

Hereafter, preferred embodiments of the method of thinning a semiconductor wafer according to the present invention is described with reference to the drawings.

Figure 1:
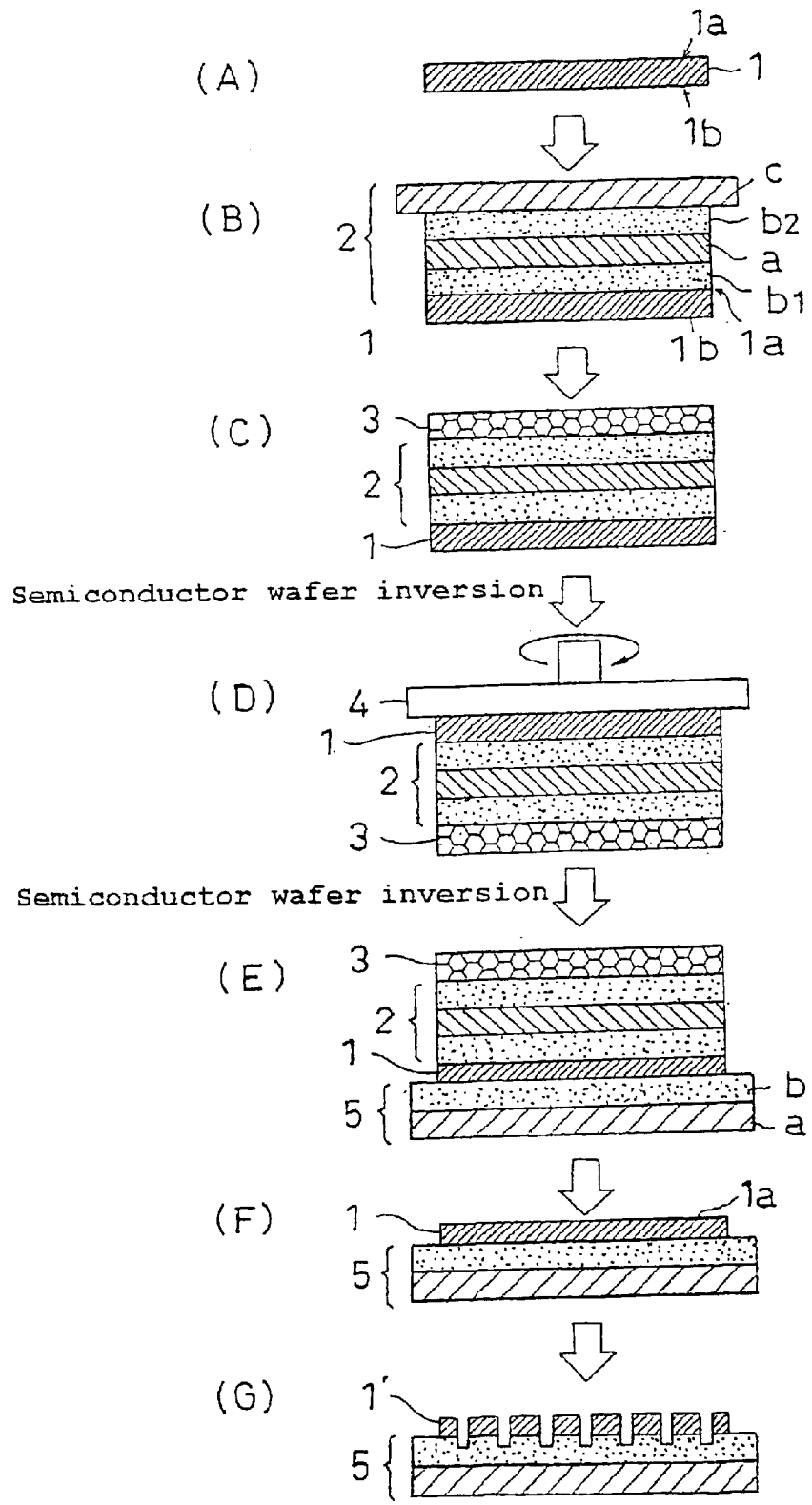
FIGS. 1A-1G

FIG. 1 is a view of steps for describing a method of thinning a semiconductor wafer according to the present invention and a subsequent dicing process.

A semiconductor wafer 1 of FIG. 1(A) has a wiring pattern formed on a front surface 1a thereof, and has a rear surface 1b on the opposite surface thereof. The wiring pattern formed on the front surface 1a has a desired pattern formed according to a conventional method.

Figure 2:
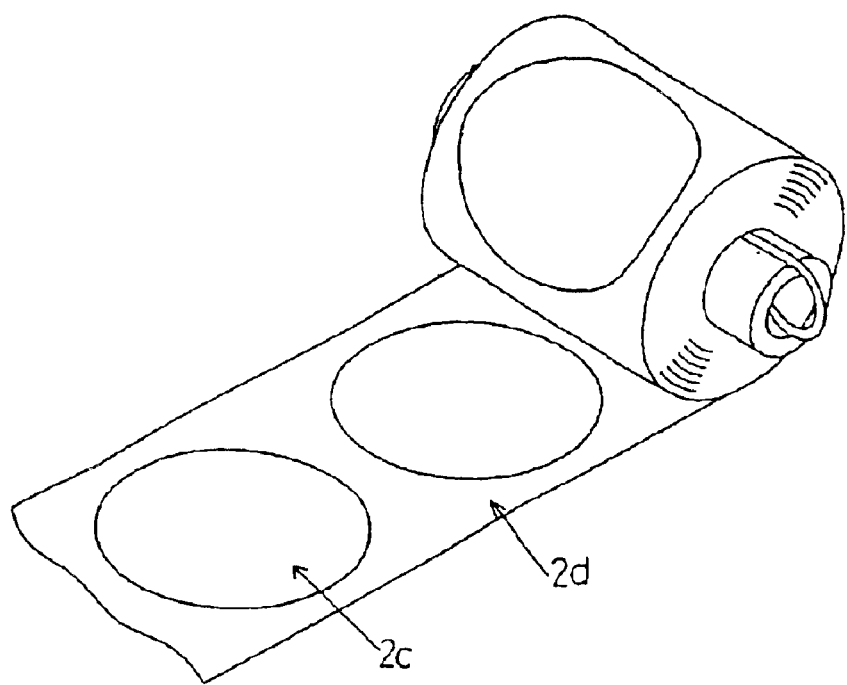
Figure 3:
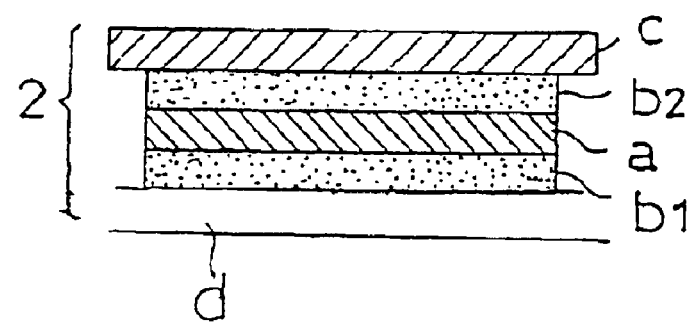

First, a two-sided adhesive sheet 2 is stuck onto front surface 1a of the above-mentioned semiconductor wafer 1, as shown in FIG. 1(B). The two-sided adhesive sheet 2 has a base material 2a and adhesive layers $2b_1$, $2b_2$, and has a release sheet 2c on adhesive layer $2b_2$. Such a two-sided adhesive sheet 2 is stuck onto the semiconductor wafer 1, after peeling a label-shaped one, for example, as shown in FIGS. 2 and 3, which is stamped out into the same shape as semiconductor wafer 1, off from the one supported on a release support sheet 2d, and aligning it with semiconductor wafer 1. In the step of sticking the two-sided adhesive sheet, semiconductor wafer 1 is fixed to a chuck table.

The two-sided adhesive sheet to be used in the sticking step need not have a label shape stamped out into the same shape as the semiconductor wafer, and may have a sheet shape. In this case, the two-sided adhesive sheet is cut into a shape of the semiconductor wafer after being stuck onto the semiconductor wafer.

As two-sided adhesive sheet 2, those conventionally used as base materials of two-sided adhesive sheets can be used without any particular limitation. For example, as base material 2a, a uniaxially oriented or biaxially oriented film of, for example, polyethylene terephthalate, polyethylene, polystyrene, polypropylene, nylon, urethane, polyvinylidene chloride, polyvinyl chloride, or the likes are exemplified. The thickness of base material 2a is usually from about 30 μm to 200 μm.

The adhesive that forms adhesive layers $2b_1$, $2b_2$ can be used various adhesives such as acryl-series, rubber-series, silicone-series, polyvinyl ether-series, or the likes, and these may be an energy beam curing type or a foaming type. As described before, adhesive layer $2b_1$, stuck onto semiconductor wafer front surface 1a is preferably made of an adhesive that can reduce its adhesive force to the semiconductor wafer front surface 1a after the thinning process, particularly a thermoreleasing type adhesive is preferable, because of facility in releasing. Further, since reutilization of two-sided adhesive sheet 2 can be easily carried out by releasing the sheet 2 from the removed support wafer 3 after the thinning process, adhesive layer $2b_2$ also is preferably made of an adhesive that can reduce its adhesive force to support wafer 3, particularly a thermoreleasing type adhesive is preferable, in the same manner as adhesive layer $2b_1$; however, if both of adhesive layers $2b_1$, $2b_2$ are made of thermoreleasing type adhesives, adhesive layer $2b_2$ released in a later step than adhesive layer $2b_1$ is preferably made of an adhesive that thermally releases at a higher temperature than adhesive layer $2b_1$. Adhesive layers $2b_1$, $2b_2$ usually have a thickness of about 20 μm to 100 μm. As a thermoreleasing type adhesive sheet, REVALPHA (trade name) manufactured by NITTO DENKO Co., Ltd. is exemplified, for example.

Next, release sheet 2c is peeled off, and support wafer 3 aligned is stuck onto adhesive layer $2b_2$ to fabricate a reinforced wafer as shown in FIG. 1(C).

In addition to the above-mentioned method, sticking a two-sided adhesive sheet onto a support wafer and sticking it onto semiconductor wafer front surface 1a can fabricate a reinforced wafer.

Supports wafer 3 is preferably made of the same material as semiconductor wafer 1. Further, the shape, size, and others of support wafer 3 are not particularly limited as long as a thinning process can be carried out on semiconductor wafer rear surface 1b. Support wafer 3 preferably has the same size as semiconductor wafer 1, as shown in FIG. 1(C) Support wafer 3 preferably has a thickness usually of about 400 μm to 800 μm.

The alignment between two-sided adhesive sheet 2 and semiconductor wafer 1 in FIG. 1(B) and the alignment between semiconductor wafer 1 and support wafer 3 in FIG. 1(C) can be carried out using an image recognition apparatus by recognizing the accurate position to compensate for a difference from the current position.

Next, as shown in FIG. 1(D), the position of semiconductor wafer 1 is inverted in an up-and-down direction, and support wafer 3 of the reinforced wafer is chucked to perform a thinning process on semiconductor wafer rear surface 1b. The thinning process can be carried out by a conventional method. As a thinning process machine 4, a grinding machine (back grinding), a CMP pad, and others may be used. The thinning process is carried out until semiconductor wafer 1 has a desired thickness.

The reinforced wafer having finished the thinning process is conveyed to a subsequent dicing step after inverting the position of semiconductor wafer 1 in an up-and-down direction In the dicing step, an adhesive tape 5 for dicing is first stuck onto the rear surface 1b of the reinforced wafer, as shown in FIG. 1(E), to fabricate a wafer mount frame. As the base material 5a and the adhesive 5b of the adhesive tape for dicing, those conventionally known in the art can be used without any particular limitation.

Next, the support wafer is removed from semiconductor wafer 1, as shown in FIG. 1(F), and subsequently the semiconductor wafer is divided into chips 1' by a dicing step of FIG. 1(G).

In removing support wafer 3 from semiconductor wafer 1 in FIG. 1(F), if two-sided adhesive sheet 2 is made of a thermoreleasing type two-sided adhesive sheet, the support wafer can be easily released by heating the chuck table of the wafer mount frame to an arbitrary temperature to reduce the adhesive force between semiconductor wafer 1 and adhesive layer $2b_1$. For example, if No. 3198 (product number) of RIBA-ALPHA (trade name) manufactured by NITTO Denko Co., Ltd. is used, the adhesive force is reduced by heating to 90° C., thereby facilitating the release of the support wafer.

In the above-mentioned FIG. 1(F), the case of removing support wafer 3 before dicing has been given as an example; however, the dicing can be carried out in a state to which support wafer 3 is stuck (the support wafer is also diced simultaneously).

Further, in the above example of FIG. 1, the case of using adhesive tape 5 for dicing in the dicing step after the thinning step of FIG. 1(D) has been given as an example; however, the dicing can be carried out without using adhesive tape 5 for dicing (without fabricating the wafer mount frame). In this case, in the dicing step after the thinning step, the support wafer 3 side of the reinforced wafer is chucked, and the dicing is carried out from semiconductor wafer rear surface 1b. Then, after the dicing is finished, support wafer 3 is removed, for example, by heating to a predetermined temperature to reduce the adhesive force between adhesive layer $2b_1$ of the thermoreleasing type two-sided adhesive sheet and semiconductor wafer 1a.

INDUSTRIAL APPLICABILITY

The method of processing a semiconductor wafer according to the present invention has the following effects. By sticking the support wafer onto the semiconductor wafer with the two-sided adhesive sheet, sufficient strength and rigidity can be obtained even after a thinning process is carried out. Therefore, it will be easier to handle the semiconductor wafers in the thinning step, and a process using a wafer carrier will be possible as well. Also, the breaking of semiconductor wafers can be restrained to the minimum.

Further, since the support wafer is stuck onto the front surface of the semiconductor wafer with the two-sided adhesive sheet, the protective tape for protecting the front surface of the semiconductor wafer, which tape has been conventionally used in the thinning process, will be no longer needed. Also, the support wafer can be an already made product that exists as a semiconductor wafer, and there is no need to fabricate the support wafer separately.

Further, since the support wafer is stuck onto the semiconductor wafer with the two-sided adhesive sheet, the removal thereof is carried out with ease and certainty. Also, by releasing and removing the two-sided adhesive sheet from the support wafer that has been removed from the semiconductor wafer, the support wafer can be reutilized. Usually, one surface of a wafer is finished as a mirror surface. Therefore, by sticking a two-sided adhesive sheet onto the mirror surface side of a support wafer to utilize the support wafer, the releasing is easy with no residual glue, thereby providing advantages in reutilizing the support wafer.

As a result of this, the workability is considerably improved even in consideration of the number of steps needed in sticking and removing the support wafer to the semiconductor wafer. Moreover, the yield is improved since the frequency of semiconductor wafers being broken is reduced.

What is claimed is:

1. A method of processing a semiconductor wafer, comprising the steps of:

sticking a support wafer, which is made of the material as semiconductor wafer, onto a front surface of a semiconductor wafer having a pattern formed thereon, with a two-sided adhesive sheet, wherein an adhesive surface of the two-sided adhesive sheet on the side that is stuck onto the front surface of the semiconductor wafer is a thermoreleasing type adhesive surface; and performing a thinning process on a rear surface of the semiconductor wafer, in a state to which said support wafer is fixed.

2. A two-sided adhesive sheet for processing a semiconductor wafer, which is used in the method of processing a semiconductor wafer according to claim 1.

* * * * *